(12) United States Patent  
Clark et al.

(10) Patent No.: US 8,400,219 B2
(45) Date of Patent: Mar. 19, 2013

(54) ANALOG CIRCUITS HAVING IMPROVED TRANSISTORS, AND METHODS THEREFOR

(75) Inventors: Lawrence T. Clark, Phoenix, AZ (US); Scott E. Thompson, Gainesville, FL (US)

(73) Assignee: Suvolta, Inc., Los Gatos, CA (US)

( * ) Notice: Subject to any disclaimer, the term of this patent is extended or adjusted under 35 U.S.C. 154(b) by 38 days.

(21) Appl. No.: 13/071,399

(22) Filed: Mar. 24, 2011

(65) Prior Publication Data

US 2012/0242409 A1  Sep. 27, 2012

(51) Int. Cl.
*H03F 3/45* (2006.01)
(52) U.S. Cl. .......................... 330/257; 330/288; 330/307
(58) Field of Classification Search .................. 330/257, 330/253, 288, 307
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A * | 5/1985 | Swanson ........................ 330/253 |
| 4,578,128 A | 3/1986 | Mundt et al. |
| 4,617,066 A | 10/1986 | Vasudev |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A * | 12/1989 | Bird et al. ...................... 330/257 |
| 4,908,681 A | 3/1990 | Nishida et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Lavéant, P. "Incorporation, Diffusion and Agglomeration of Carbon in Silicon", Solid State Phenomena, vols. 82-84, pp. 189-194 2002.

(Continued)

*Primary Examiner* — Khanh V Nguyen
(74) *Attorney, Agent, or Firm* — Baker Botts L.L.P.

(57) ABSTRACT

Circuits are disclosed that may include a plurality of transistors having controllable current paths coupled between at least a first and second node, the transistors configured to generate an analog electrical output signal in response to an analog input value; wherein at least one of the transistors has a deeply depleted channel formed below its gate that includes a substantially undoped channel region formed over a relatively highly doped screen layer formed over a doped body region.

13 Claims, 9 Drawing Sheets

U.S. PATENT DOCUMENTS

| | | | |
|---|---|---|---|
| 5,384,476 A | 1/1995 | Nishizawa et al. |
| 5,426,328 A | 6/1995 | Yilmaz et al. |
| 5,444,008 A | 8/1995 | Han et al. |
| 5,559,368 A | 9/1996 | Hu et al. |
| 5,608,253 A | 3/1997 | Liu et al. |
| 5,622,880 A | 4/1997 | Burr et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,020,227 A | 2/2000 | Bulucea |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,245,618 B1 | 6/2001 | An et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,994 B1 | 9/2004 | Hoke et al. |
| 6,808,004 B2 | 10/2004 | Kamm et al. |
| 6,808,994 B1 * | 10/2004 | Wang ............................ 438/294 |
| 6,813,750 B2 | 11/2004 | Usami et al. |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 * | 6/2006 | Babcock et al. .............. 257/408 |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,122,411 B2 | 10/2006 | Mouli |
| 7,127,687 B1 | 10/2006 | Signore |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |

| | | |
|---|---|---|
| 7,226,833 B2 | 6/2007 | White et al. |
| 7,226,843 B2 | 6/2007 | Weber et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,741,138 B2 | 6/2010 | Cho |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,818,702 B2 | 10/2010 | Mandelman et al. |
| 7,829,402 B2 | 11/2010 | Matocha et al. |
| 7,831,873 B1 | 11/2010 | Trimberger et al. |
| 7,867,835 B2 | 1/2011 | Lee et al. |
| 7,883,977 B2 | 2/2011 | Babcock et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,989,900 B2 | 8/2011 | Haensch et al. |
| 8,004,024 B2 | 8/2011 | Furukawa et al. |
| 8,012,827 B2 | 9/2011 | Yu et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,067,279 B2 | 11/2011 | Sadra et al. |
| 8,105,891 B2 | 1/2012 | Yeh et al. |
| 8,106,424 B2 | 1/2012 | Schruefer |
| 8,106,481 B2 | 1/2012 | Rao |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,201,122 B2 | 6/2012 | Dewey, III et al. |
| 8,214,190 B2 | 7/2012 | Joshi et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,266,567 B2 | 9/2012 | El Yahyaoui et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0180488 A1 | 9/2004 | Lee |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |

| | | |
|---|---|---|
| 2006/0071278 A1 | 4/2006 | Takao |
| 2006/0154428 A1 | 7/2006 | Dokumaci |
| 2006/0203581 A1 | 9/2006 | Joshi et al. |
| 2006/0223248 A1 | 10/2006 | Venugopal et al. |
| 2007/0040222 A1 | 2/2007 | Van Camp et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0302388 A1 | 12/2009 | Cai et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0148153 A1 | 6/2010 | Hudait et al. |
| 2010/0149854 A1 | 6/2010 | Vora |
| 2010/0187641 A1 | 7/2010 | Zhu et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1* | 4/2011 | Shifren et al. ............... 257/402 |
| 2011/0095811 A1 | 4/2011 | Chi et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0248352 A1 | 10/2011 | Shifren et al. |
| 2011/0309447 A1 | 12/2011 | Arghavani et al. |
| 2012/0021594 A1 | 1/2012 | Gurtej et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

* cited by examiner

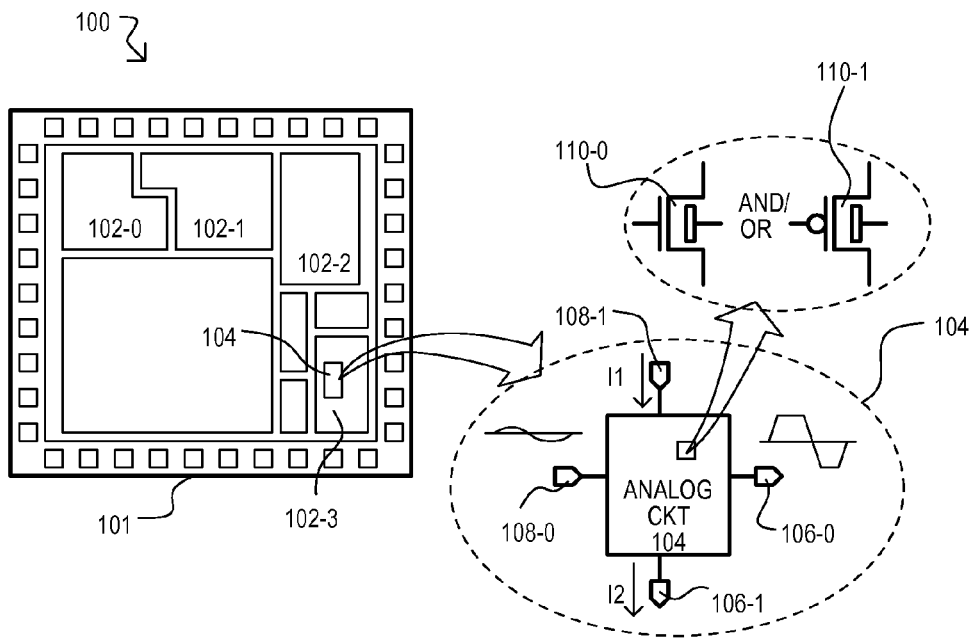
FIG. 1
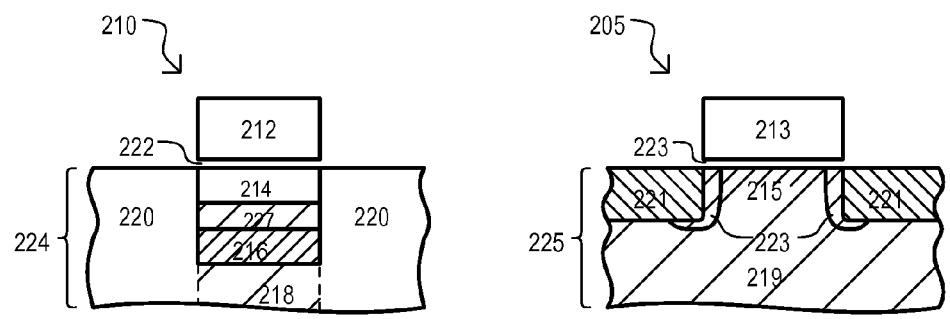
FIG. 2A
FIG. 2B
(BACKGROUND ART)
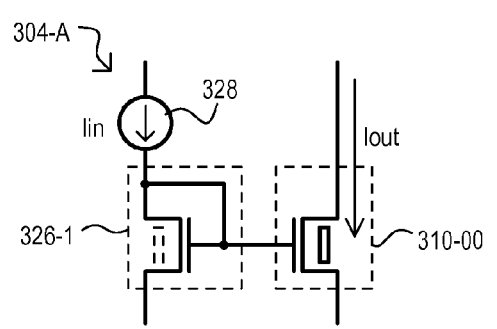
FIG. 3A
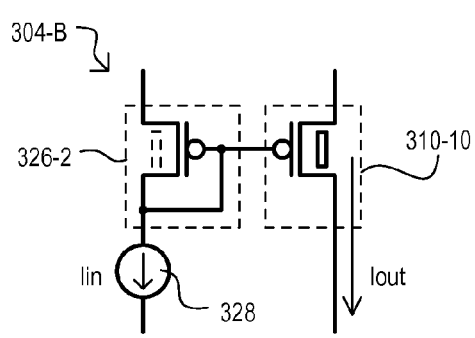
FIG. 3B

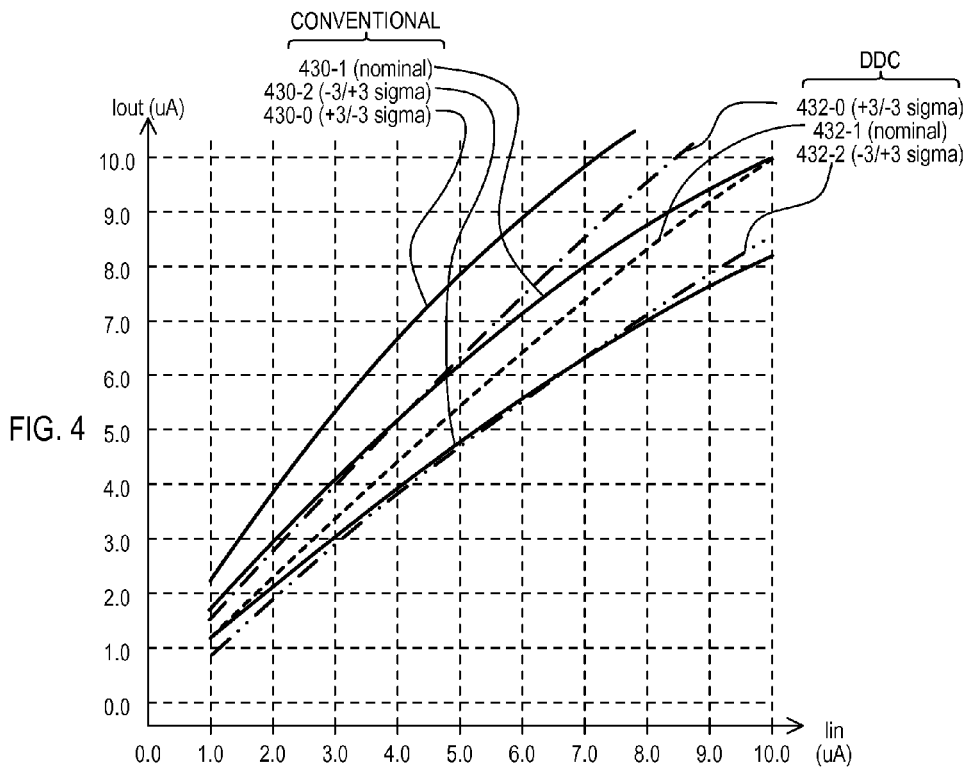
FIG. 4
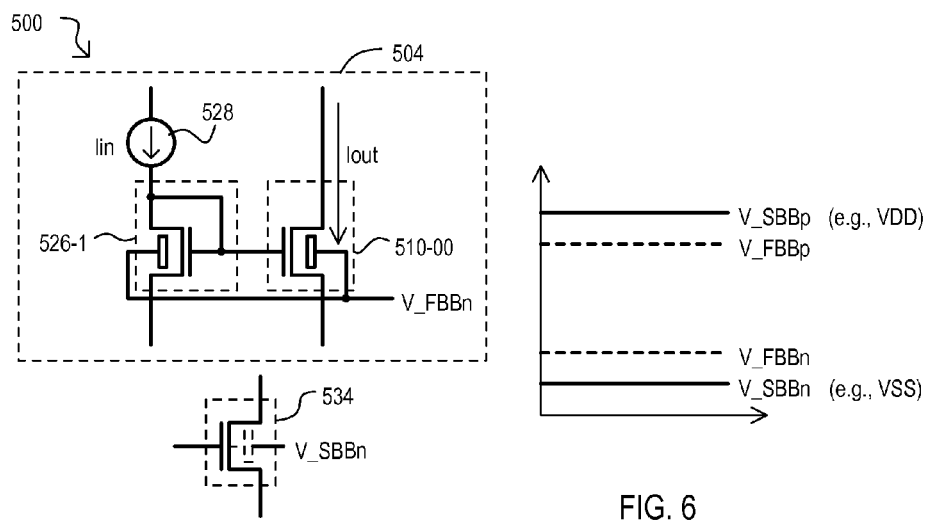
FIG. 5
FIG. 6

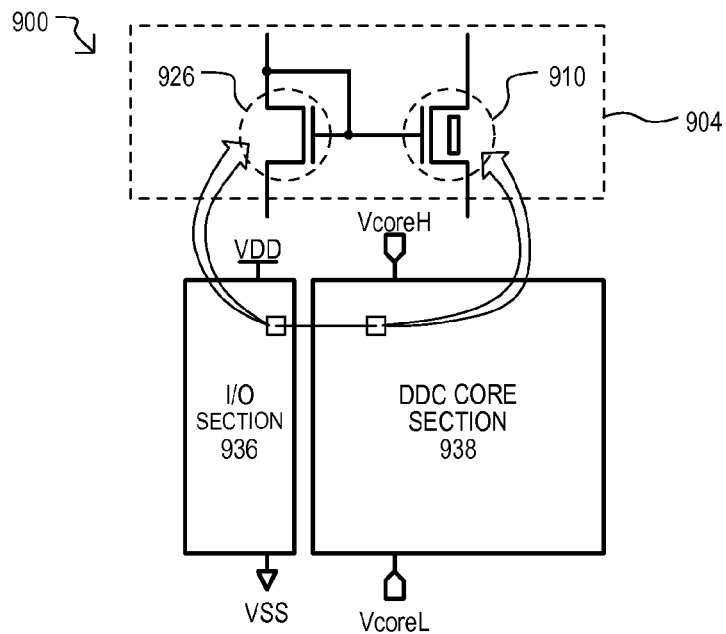
FIG. 9
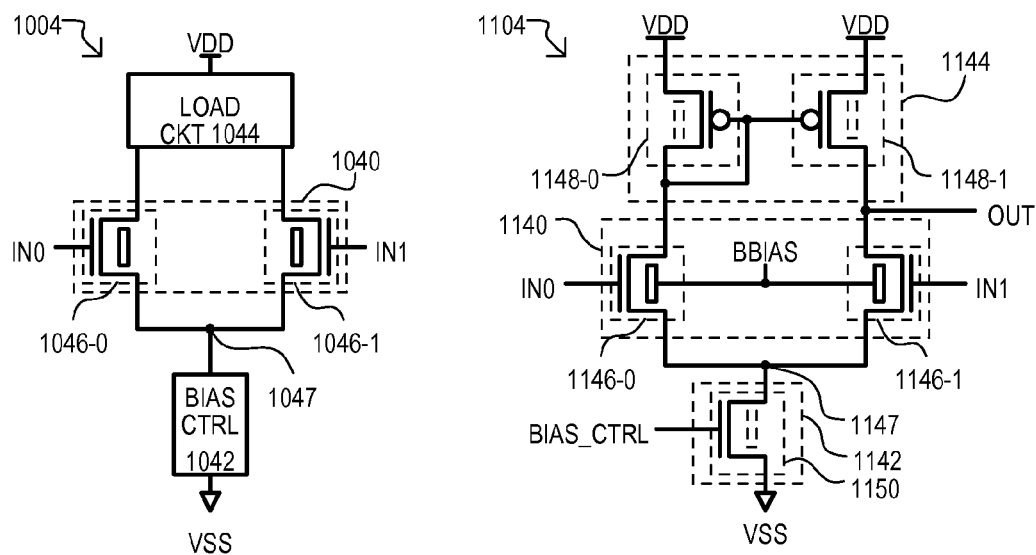
FIG. 10
FIG. 11

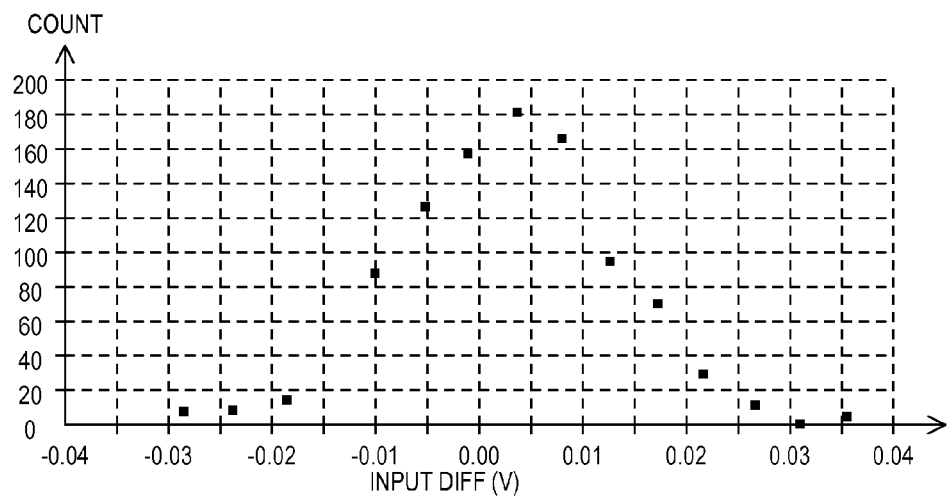
FIG. 15A (Conventional Halo)
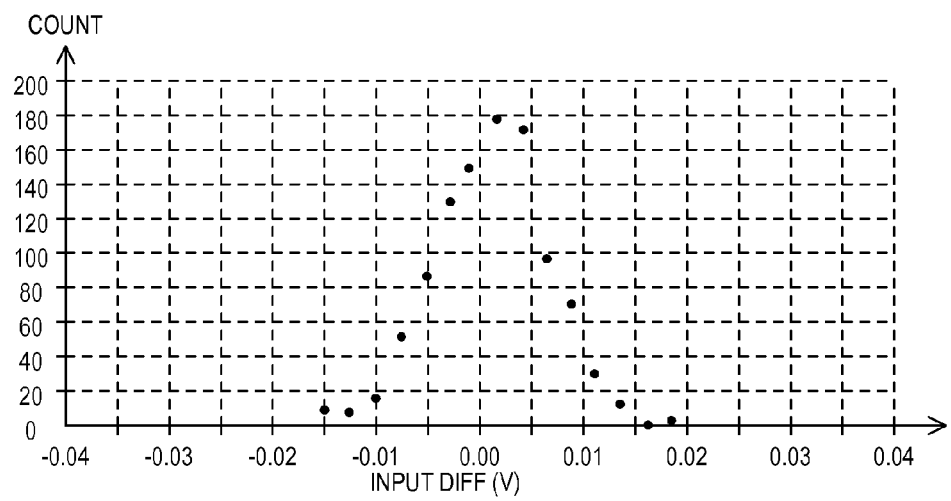
FIG. 15B (DDC)

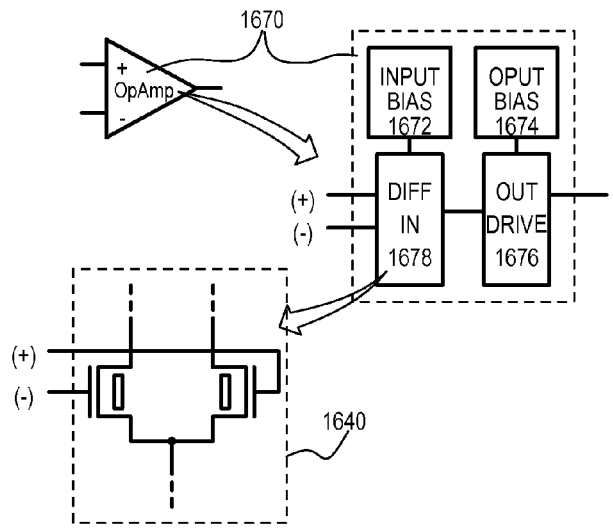
FIG. 16
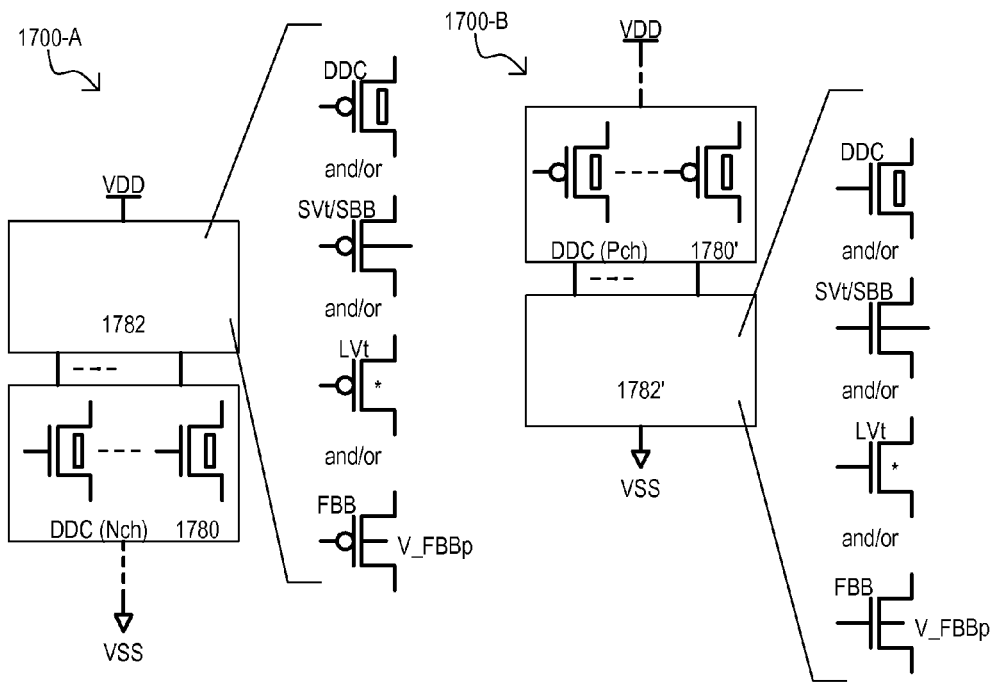
FIG. 17A
FIG. 17B

ANALOG CIRCUITS HAVING IMPROVED TRANSISTORS, AND METHODS THEREFOR

TECHNICAL FIELD

The present invention relates generally to electronic circuits, and more particularly to analog circuits for generating analog values.

BRIEF DESCRIPTION OF THE DRAWINGS

FIG. 1 shows an integrated circuit (IC) device according to an embodiment.

FIG. 2A shows a deeply depleted channel (DDC) transistor that may be included in embodiments. FIG. 2B shows a conventional transistor.

FIGS. 3A and 3B show current mirror circuits according to embodiments.

FIG. 4 is a graph showing simulation results of a current mirror circuit according to one particular embodiment.

FIG. 5 is a block schematic diagram of another IC device according to an embodiment.

FIG. 6 is a graphs showing transistor body biasing variations that can be included in embodiments.

FIG. 9 is a block schematic diagram of a further IC device according to an embodiment.

FIG. 10 is a block schematic diagram of an analog circuit having a differential pair of DDC transistors according to an embodiment.

FIG. 11 is a schematic diagram of a differential amplifier circuit according to an embodiment.

FIGS. 15A and 15B are graphs showing simulation results according to a conventional comparator circuit and according to a particular embodiment.

FIG. 16 is a block schematic diagram of an operational amplifier according to an embodiment.

FIGS. 17A and 17B are block diagrams of IC devices according to various embodiments.

DETAILED DESCRIPTION

Figures 7A, 7B:
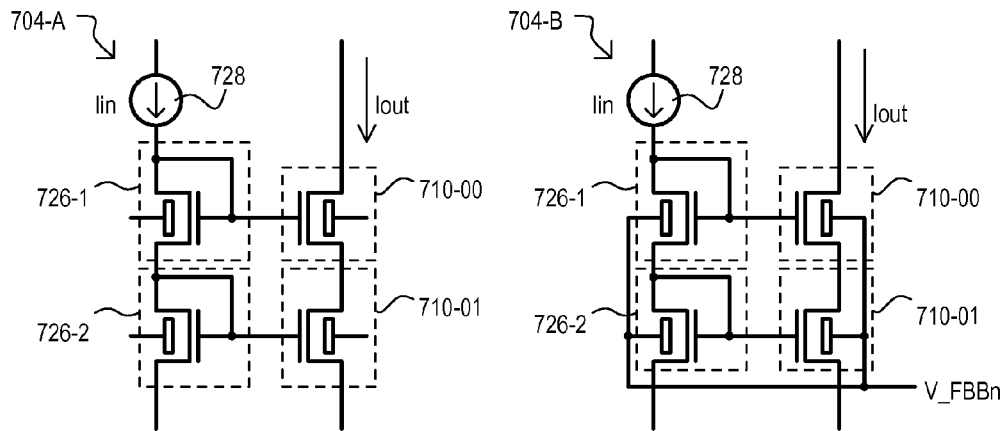
FIGS. 7A to 7D show cascode type current mirror circuits according to embodiments.

Various embodiments of the present invention will now be described in detail with reference to a number of drawings. The embodiments show analog circuits and related methods that may be included in integrated circuit devices to provide improved performance over conventional analog circuit approaches.

In the various embodiments below, like items are referred to by the same reference character but the leading digit(s) corresponding to the figure number.

Referring now to FIG. 1 an integrated circuit (IC) device according to one embodiment is show in a top plan view, and designated by the general reference character 100. An IC device 100 may be formed as a "die" having substrate 101 containing the various circuits therein. An IC device 100 may include one or more circuit sections, and FIG. 1 identifies four circuit sections as 102-0 to 102-3. Any or all of circuit sections (102-0 to 102-3) may include analog circuit blocks that perform analog functions for the IC device 100.

In the embodiment shown, circuit section 102-3 can be an analog circuit block that includes one or more analog circuits, one shown as 104. An analog circuit 104 may generate an analog voltage and/or current within IC device 100 to enable a circuit function. An analog circuit 104 may generate an output analog value in response to an input analog value and/or may generate an output analog value based on biasing conditions, as but two examples. Accordingly, an analog circuit 104 may include one or more output nodes (two shown as 106-0, 106-1) and may or may not include input nodes (two shown as 108-0, 108-1). It is noted that in some embodiments, an output node and input node may be the same node.

Referring still to FIG. 1, an analog circuit 104 may include one or more "deeply depleted channel" (DDC) transistors. A DDC transistor includes both a highly doped "screening" layer below a gate that defines the extent of the depletion region below the gate in operation, and an undoped channel extending between source and drain of a transistor. Typically, to prevent contamination of the undoped channel, transistors are manufactured without halo or "pocket" implants, and anneal conditions are tightly controlled to prevent unwanted diffusion of dopants into the undoped channel. To improve threshold voltage control and reduce variability in threshold voltage, conventional threshold voltage (Vt) implants and threshold voltage modifying halo implants are also avoided. Instead, a threshold voltage set layer can be grown as a blanket or as selective epitaxial layers and doped by controlled implants, diffusion from the screen layer, or substitutional deposition. This threshold voltage set layer is used to finely adjust or tune the threshold voltage of individual or blocks of transistors. Such a threshold voltage set layer is positioned between the undoped channel and the screen layer and may alternatively contact or be separated from the screen layer. As compared to conventional doped channel transistors, such DDC transistors can be more closely matched in device characteristics, in part because they have reduced channel random dopant fluctuations that can result in variable threshold voltage set points. Further examples of DDC transistor structure and manufacture are disclosed in in U.S. patent application Ser. No. 12/708,497, filed on Feb. 18, 2010, titled ELECTRONIC DEVICES AND SYSTEMS, AND METHODS FOR MAKING AND USING THE SAME, by Scott E. Thompson et al., as well as U.S. patent application Ser. No. 12/971,884, filed on Dec. 17, 2010 titled LOW POWER SEMICONDUCTOR TRANSISTOR STRUCTURE AND METHOD OF FABRICATION THEREOF and U.S. patent application Ser. No. 12/971, 955 filed on Dec. 17, 2010 titled TRANSISTOR WITH THRESHOLD VOLTAGE SET NOTCH AND METHOD OF FABRICATION THEREOF the respective contents of which are incorporated by reference herein.

DDC transistors included within an analog circuit may include n-channel transistors, p-channel transistors, or both. N-channel DDC transistors will be represented in this disclosure by the symbol shown as 110-0 in FIG. 1. P-channel DDC transistors will be represented in this disclosure by the symbol shown as 110-1 in FIG. 1. As noted above, DDC transistors may advantageously include a substantially undoped channel region formed over a relatively highly doped screening layer. As will be described in more detail below, DDC transistors may present analog circuit elements having less variation than conventional counterparts, which can result in improved analog circuit performance as compared to analog circuits constructed with conventional circuit elements of the same size.

Referring now to FIG. 2A, one exemplary representation of a DDC transistor is shown in a side cross sectional view, and designated by the general reference character 210. DDC transistor 210 may include a gate 212 separated from a substrate 224 by a gate insulator 222. A substantially undoped channel region 214 may be formed below gate 212. A doped screening layer 216 may be formed below channel region 214. It is understood that there may be other layers between channel region 214 and screening layer 216 (e.g., a threshold voltage set layer 227). A substrate 224 may be formed of more than one semiconductor layer. As but one example, a substrate may include one or more "epitaxial" layers formed on a bulk semiconductor substrate.

A screening layer 216 may be doped to an opposite conductivity type of the transistor channel type (e.g., an n-channel DDC transistor will have a p-doped screening layer). A screening layer 216 doping concentration may be greater than a concentration of a body region 218. FIG. 2A also shows source and drain regions 220 on opposing lateral sides of channel region 214. Source and drain regions 220 may include a source and drain diffusion. More particular types of DDC source and drain structures, relative to substantially undoped channel region will be described in more detail below.

Threshold voltage set layer 227 can be a doped layer formed between screening layer 216 and substantially undoped channel region 214. Threshold voltage set layer 227 may be doped to achieve a desired threshold voltage in a DDC transistor 210.

Referring to FIG. 2B, one representation of a conventional transistor is shown for comparison to that shown in FIG. 2A. Conventional transistor 205 may include a gate 213 separated from a substrate 225 by a gate insulator 223. A channel region 215 may be formed below a gate 213 between source/drain diffusions 221. A channel region 215 may be doped to a conductivity type opposite to that of source/drain diffusions 221, and the same as that of a transistor body region 219. "Pocket" or "halo" implant regions 223 may be formed between source/drain diffusions 221 and channel region 215.

In this way, an integrated circuit device may include analog circuits formed with DDC transistors.

Referring now to FIG. 3A, one particular example of an analog circuit according to an embodiment is shown in schematic diagram and designated by the general reference character 304-A. Analog circuit 304-A is a current mirror circuit that provides an output current Iout that tracks an input current Iin. Output current Iout may be provided by way of a DDC transistor. An output current (Iout) may more closely track input current (Iin) as compared to conventional circuits employing doped channel devices, as the DDC device threshold voltage may subject to less variation than a doped channel counterpart.

In the particular embodiment shown, current mirror circuit 304-A may include a reference transistor 326-1 and a mirror transistor 310-00 of a same conductivity type (in this case n-channel devices). A reference transistor 326-1 may have a drain connected to receive input current Iin from a current source 328, a gate connected to its drain, and a source connected, directly or indirectly to a low power supply node (e.g., a VSS node). A reference transistor 326-1 may preferably be a DDC transistor. However, in alternate embodiments, a reference transistor 326-1 may not be a DDC transistor. A mirror transistor 310-00 is a DDC transistor having a gate connected to the gate/drain of reference transistor 326-1, and a source connected, directly or indirectly to a low power supply node.

Because mirror transistor 310-00 receives a same gate bias as reference transistor 326-1, current (Iout) flowing into mirror transistor 310-00 may track input current (Iin). In the event both transistors (326-1 and 310-00) are DDC transistors, such a tracking may be advantageously closer than conventional current mirror formed with doped channels, which may suffer from random doping fluctuation leading to greater device mismatch. A mirror transistor 310-00 may be identically sized to a reference transistor 326-1, in which Iout≅Iin, or a mirror transistor 310-00 may be scaled with respect to reference transistor 326-1 by a factor of K, in which case Iout≅K*Iin.

Referring now to FIG. 3B, another example of a current mirror circuit according to an embodiment is shown in schematic diagram and designated by the general reference character 304-B. Current mirror circuit 304-B shows the same general circuit as FIG. 3A, but using p-channel devices. Current mirror circuit 304-B may be subject to the same variations and advantages of that shown in FIG. 3A.

Referring now to FIG. 4, an advantageous response of a current mirror circuit according to an embodiment is shown in a graph. FIG. 4 shows a simulation response of a current mirror like that of FIG. 3A, in which both a reference device 326 and mirror device 310-00 are n-channel DDC transistors of the same size. A vertical axis shows an output current (Iout) provided by mirror device 310-00, and a horizontal axis shows an input current (Iin) sourced to reference device 326-1. Responses of the DDC current mirror are shown by dashed line responses 432-0, -1, -2. Line 432-1 shows a nominal response, corresponding to a typical transistor response for the DDC transistors. Line 432-0 shows a first extreme case response, in which a mirror device 310-00 has a maximum statistical deviation in one direction (+3σ) while a reference device 326 deviates in the opposite direction (−3σ). Line 432-2 shows a second extreme case response, in which the devices vary in the other opposing direction (i.e., mirror device 310-00 is −3σ, while reference device 326 is +3σ).

For comparison, FIG. 4 also includes the same responses noted above, but with a current mirror formed with conventional transistors (shown as solid lines 430-0, -1, -2) of the same size. As shown, a current mirror response according to an embodiment (i.e., 432-0, -1, -2) has a tighter response (i.e., Iout more closely tracks Iin) as compared to the conventional case (430-0, -1, -2).

Referring now to FIG. 5, an IC device according to another embodiment is shown in a block schematic diagram and designated by the general reference character 500. An IC device 500 may include a current mirror circuit 504 and one or more standard bias transistors (one shown as 534). Current mirror circuit 504 may have a configuration like that of FIG. 3A. However, FIG. 5 differs from FIG. 3A in that reference and mirror transistors (526-1 and 501-00) can have bodies that receive a "forward" body bias voltage (V_FBBn). In contrast, a standard bias transistor (e.g., 534) may have a body that receives a standard body bias voltage (V_SBBn). A forward body bias voltage may reduce a threshold voltage of transistors as compared to a standard body bias voltage. Accordingly, in FIG. 5, transistors 526-1 and 510-00 may be considered forward body biased (FBB) DDC devices. FBB DDC devices can have a lower drain-source saturation voltage (VDSAT) than standard body biased counterparts. A lower VDSAT may enable lower power supply voltages and/or may increase an operating range for signals generated by, or operated on, an IC device.

FIG. 6 is a graph showing forward and standard body biasing voltages according to an embodiment. A standard body bias voltage for p-channel transistors V_SBBp may be a relatively high positive voltage, and in some embodiments can be a high power supply voltage VDD. A forward body bias voltage for p-channel transistors V_FBBp may be less than V_SBBp. Similarly, a standard body bias voltage for n-channel transistors V_SBBn may be a relatively low voltage, and in some embodiments can be a low power supply voltage VSS. A forward body bias voltage for n-channel transistors V_FBBn may be greater than V_SBBn.

Different body biasing as described herein may be static (i.e., transistors body biases are substantially constant during device operation), or may be dynamic, changing in response to circuit inputs and/or conditions.

In this way, current mirror circuits may include DDC transistors in various configurations.

Referring now to FIGS. 7A to 7D, additional analog circuits according to embodiments are a shown in schematic diagrams. FIGS. 7A to 7D show cascode type current mirror circuits according to various embodiments. Cascode type current mirror circuits may provide higher output impedance than single stage arrangements like that of FIGS. 3A to 3B.

Referring to FIG. 7A, a current mirror circuit 704-A may include a first reference transistor 726-1 and first mirror transistor 710-00 arranged in the same fashion as FIG. 3A. In addition, second reference transistor 726-1 and second mirror transistor 710-01 may be connected in a cascode type arrangement. In the embodiment shown, all transistors are DDC transistors. However, in alternate embodiments, less than all transistors may be DDC transistors.

Referring to FIG. 7B, a current mirror circuit 704-B may have the same general arrangement as that shown in FIG. 7A, however all transistors may receive a forward body bias voltage V_FBBn. Accordingly, it is understood that current mirror circuit 704-B is included in a device having other n-channel transistors that receive a standard body bias voltage (i.e., a body bias voltage lower than V_FBBn). In alternate embodiments, less than all transistors may be DDC transistors.

Figures 7C, 7D:
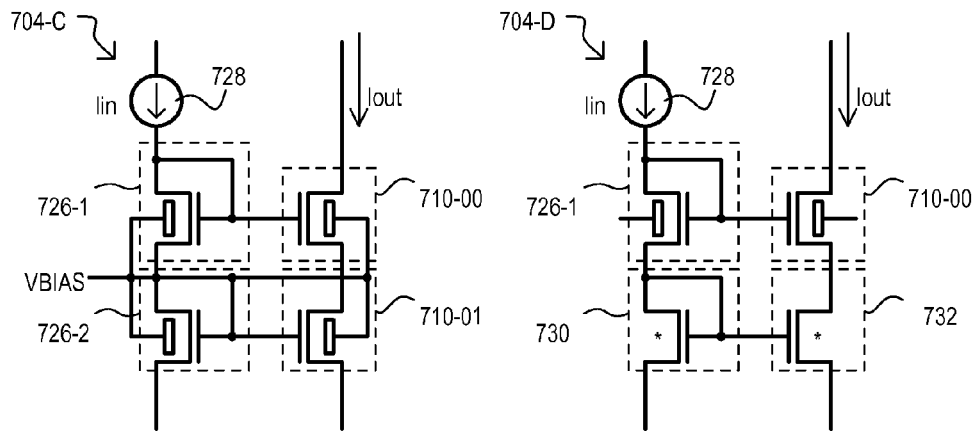

Referring to FIG. 7C, a current mirror circuit 704-C may have the same general arrangement as that shown in FIG. 7B, however a body of all transistors may be driven with a bias voltage VBIAS. Further, such a bias voltage may drive the gate-gate connection of the cascode stage formed by transistors 710-01 and 726-2.

Referring to FIG. 7D, a current mirror circuit 704-D may have a similar arrangement as that shown in FIG. 7B. However, in FIG. 7D a cascode stage may be formed by low threshold voltage (Vt) transistors 730 and 732. In the embodiment of FIG. 7D, it is understood that current mirror circuit 704-D is included in a device having other n-channel transistors, and such other n-channel transistors may have a larger Vt than the low Vt devices.

In this way, cascode connected current mirror circuits may include DDC transistors in various configurations.

Figures 8A, 8B:
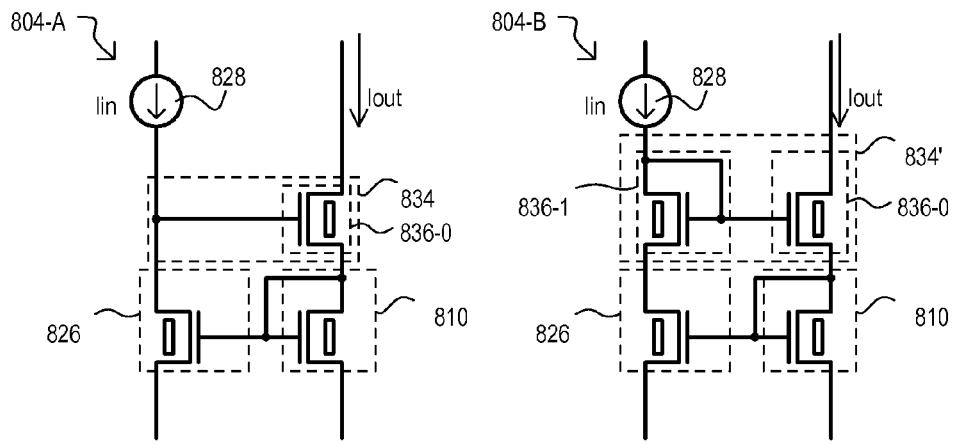
FIGS. 8A and 8B show Wilson type current mirror circuits according to embodiments.

Referring now to FIGS. 8A and 8B, additional analog circuits according to embodiments are shown in schematic diagrams. FIGS. 8A and 8B show Wilson type current mirror circuits according to various embodiments. Wilson type current mirror circuits may also provide higher output impedance than single stage arrangements like that of FIGS. 3A to 3B.

Referring to FIG. 8A, a current mirror circuit 804-A may include a reference transistor 826, a mirror transistor 810, and an input stage 834. A reference transistor 826 may have a drain connected to receive input current (Iin) from a current source 828 and a source connected, directly or indirectly, to a low power supply node (e.g., VSS node). A mirror transistor 810 may have its gate connected to its drain and to the gate of reference transistor 826, and a source connected, directly or indirectly, to a low power supply node. Input stage 834 may include a first input transistor 836-0 having a drain that provides output current Iout, a gate connected to the drain of reference transistor 826, and a source connected to the drain-gate of mirror transistor 810.

Referring to FIG. 8B, a current mirror circuit 804-B may have the same general arrangement as that shown in FIG. 8A, however input stage 834' may further include a second input transistor 836-1 having a gate and drain connected to a gate of first input transistor 836-0, and a source connected to the drain of reference transistor 826.

It is noted that in the embodiments of FIGS. 8A and 8B, preferably all transistors may be DDC transistors. However, in alternate embodiments one or more of the transistors may be standard body biased transistors, forward body biased transistors, standard Vt transistors and/or low Vt transistors, as noted above.

In this way, Wilson type current mirror circuits may include DDC transistors in various configurations.

Embodiments of the invention may include analog circuits having transistor constituents split over different device sections, with one such section including DDC transistors. One very particular embodiment showing such an arrangement is set forth in FIG. 9.

Referring to FIG. 9, an IC device is shown in a block diagram and designated by the general reference character 900. An IC device 900 may include an input/output (I/O) section 936 and DDC core section 938. In the embodiment shown, an I/O section 936 may be powered between high power supply voltages VDD and VSS. A DDC core section 938 may include DDC type transistors, and may be powered between lower power supply voltages VcoreH and VcoreL, where VcoreH<VDD and VcoreL>VSS. Circuits within IC device 900 may include transistors in both sections 936 and 938.

In the particular embodiment of FIG. 9, a current mirror circuit 904 is shown that spans sections 936 and 938. More particularly, a current mirror circuit 904 may include a reference transistor 926 formed in I/O section 936, and a mirror transistor 910 formed in DDC core section 938. In particular embodiments, transistors within I/O section 936 may have a thicker gate insulator and/or doping profiles suitable for higher operating voltages than the DDC transistors of section 938.

In this way, analog circuits may span differently powered sections of an IC device.

Referring now to FIG. 10, a further analog circuit according to an embodiment is shown in a block schematic diagram. Circuit 1004 can include a differential pair of DDC transistors 1040, a bias control circuit 1042, and a load circuit 1044. Differential pair 1040 may include a first DDC transistor 1046-0 having a drain connected to load circuit 1044, a gate coupled to a first input IN0, and a source coupled to a bias node 1047, and a second DDC transistor 1046-1 having a drain connected to load circuit 1044, a gate coupled to a second input IN1, and a source coupled to a bias node 1047. Preferably, first and second transistors 1046-0/1 may be matched in size.

A bias control circuit 1042 may be connected between a bias node 1047 a low power supply node VSS. A load circuit 1044 may be connected between the drains of transistors 10460/1 and a high power supply node VDD.

A differential pair 1040 may provide improved compare operations with respect to signals received at inputs IN0 and IN1, as there may be less variation in the Vts of such devices, as their channels do not suffer from random dopant fluctuation.

In this way, an IC device may include a differential pair of DDC transistors.

Referring now to FIG. 11, a particular analog circuit including a differential pair of DDC transistors according to another embodiment is shown in block schematic diagram. FIG. 11 shows a differential amplifier circuit 1104 that includes items like those shown in FIG. 10.

FIG. 11 differs from that of FIG. 10 in that a bias control circuit 1142 may include a bias transistor 1150 having a source-drain path connected between bias node 1147 and a low power supply node VSS, and a gate that receives a bias voltage BIAS_CTRL. Further, a load circuit 1044 may be a current mirror formed with p-channel devices 1148-0/1. An output of differential amplifier OUT may be at a drain-drain connection of transistors 1148-1/1146-1.

Preferably, the transistors of differential amplifier circuit 1104 may all be DDC transistors. However, in alternate embodiments, any of transistors 1148-0/1, 1150 may be conventional transistors and/or low Vt transistors, such low Vt transistors including conventional and/or DDC transistors (i.e., DDC transistors with lower threshold voltages than other like conductivity DDC transistors in the device). Still further, all such transistors may have body biasing variations described herein, including standard body biasing and forward body biasing.

In this way, an IC device may include a differential amplifier that includes DDC transistors.

Figure 12A:
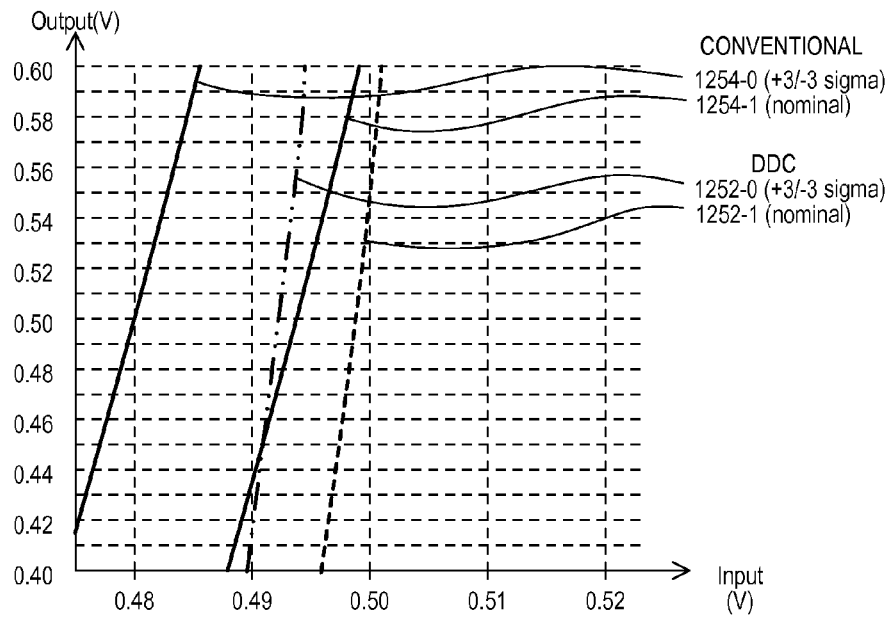
FIGS. 12A to 12C are graphs showing simulation results for a differential amplifier circuit according to one particular embodiment.

Referring to FIG. 12A, an advantageous response of a differential amplifier circuit according to an embodiment is shown in a graph. FIG. 12A shows a simulation response of a differential amplifier on a 28 nm generation process, like that of FIG. 11, in which all transistors are DDC transistors having 100 nanometer (nm) gate lengths. A vertical axis shows an output voltage, and a horizontal axis shows an input voltage. Consequently, the response lines are understood to represent an amplifier gain and offset.

Responses of such a DDC based differential amplifier are shown by dashed line responses 1252-0/1. Line 1252-1 shows a nominal response, corresponding to a typical transistor response for the DDC transistors. Line 1252-0 shows an extreme case response, in which a first load transistor 1148-0 has a maximum statistical deviation in one direction (−3σ) while the second load transistor 1148-1 deviates in the opposite direction (+3σ). At the same time, differential pair transistor 1146-0 has maximum statistical deviation (+3σ) opposite to that of the other differential pair transistor 1146-1 and first load transistor 1148-0.

For comparison, FIG. 12A also includes the same responses, but for a differential amplifier having conventional transistors (shown as solid lines 1254-0/1).

As shown, a differential amplifier response according to an embodiment (i.e., 1252-0/2) exhibits less voltage offset due to variation, and may provide greater gain.

Figure 12B:
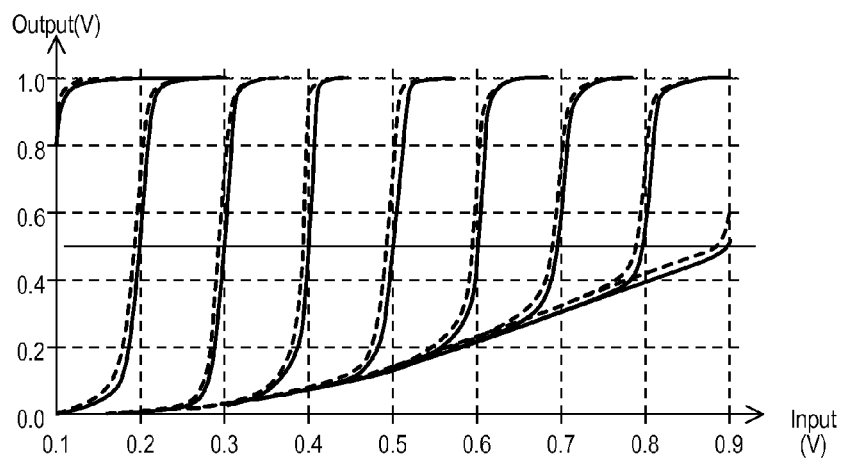

Referring to FIG. 12B, a large signal simulation response for the differential amplifier circuit of FIG. 12A. Responses of the DDC based differential amplifier with an extreme mismatch arrangement are shown by dashed lines. An ideal response (e.g., no mismatch) is shown by solid lines.

Figure 12C:
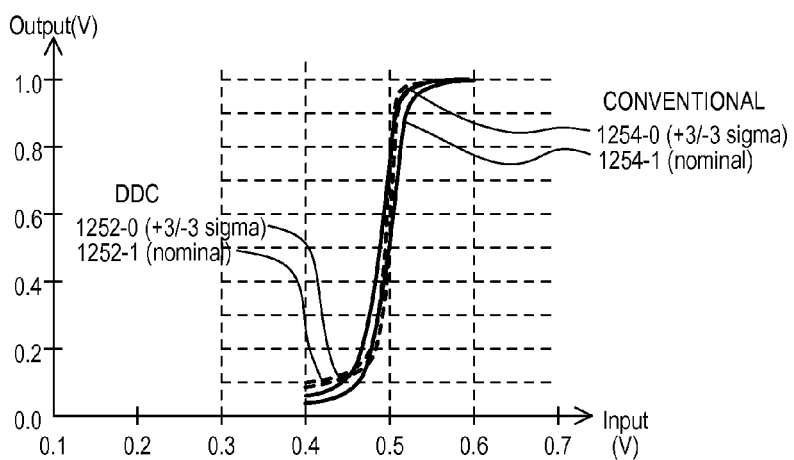

Referring to FIG. 12C shows a same set of responses as FIG. 12A, but in the large signal range. As shown, a DDC based differential amplifier according to an embodiment may provide greater gain and with less offset.

Figure 13A:
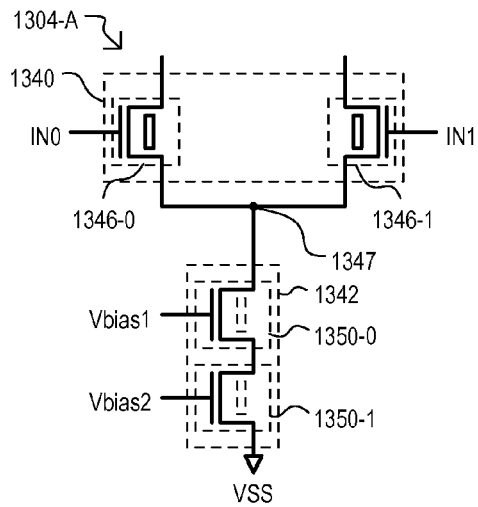
FIGS. 13A to 13C are schematic diagrams of differential amplifier circuits according to further embodiments.

Referring now to FIG. 13A, a portion of a differential amplifier according to a further embodiment is shown in block schematic diagram. FIG. 13A shows a differential amplifier circuit 1304-A that includes items like those shown in FIG. 11.

FIG. 13A differs from FIG. 11 in that a bias control circuit 1342 may include a cascode configuration, including a first bias transistor 1350-0 and second bias transistor 1350-1 having source-drain paths in series between the bias node 1347 and a low power supply node VSS. First and second bias transistors (1350-0/1) may receive a first bias voltage Vbias1 and second bias voltage Vbias2 on their respective gates. It is noted that bias transistors (1350-0/1) may be DDC transistors in some embodiments. However, in other embodiments, one or both of the bias transistors (1350-0/1) may be conventional transistors and/or low Vt transistors. Further, one or both of such transistors may have body biasing variations described herein, including standard body biasing and forward body biasing.

Figure 13B:
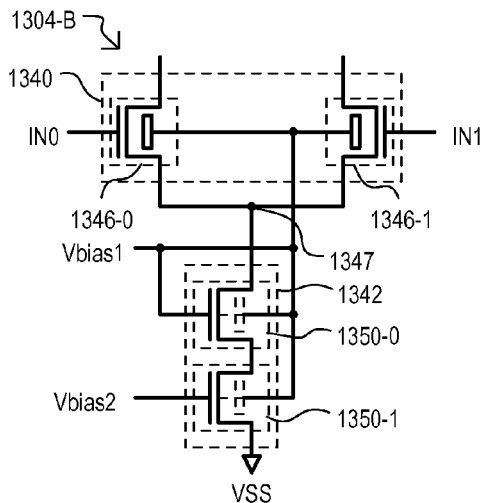

Referring now to FIG. 13B, a portion of another differential amplifier according to an embodiment is shown in block schematic diagram. FIG. 13B shows a differential amplifier circuit 1304-B that includes items like those shown in FIG. 13A. FIG. 13B differs from FIG. 13A in that first and second bias transistors 1350-0/1 as well as transistors 1346-0/1 of the differential pair 1340 may have bodies driven by the bias voltage Vbiasl received at the gate of first bias transistor 1350-0.

Figure 13C:
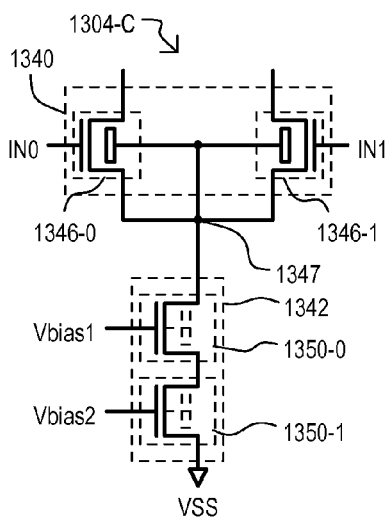

Referring now to FIG. 13C, a portion of another differential amplifier according to an embodiment is shown in block schematic diagram. FIG. 13C shows a differential amplifier circuit 1304-C that includes items like those shown in FIG. 13A. FIG. 13C differs from FIG. 13A in that bodies of differential pair transistors 1346-0/1 may be connected to bias node 1347. Such an arrangement may essentially eliminate the body effect on the operation of differential pair 1340.

Figure 14:
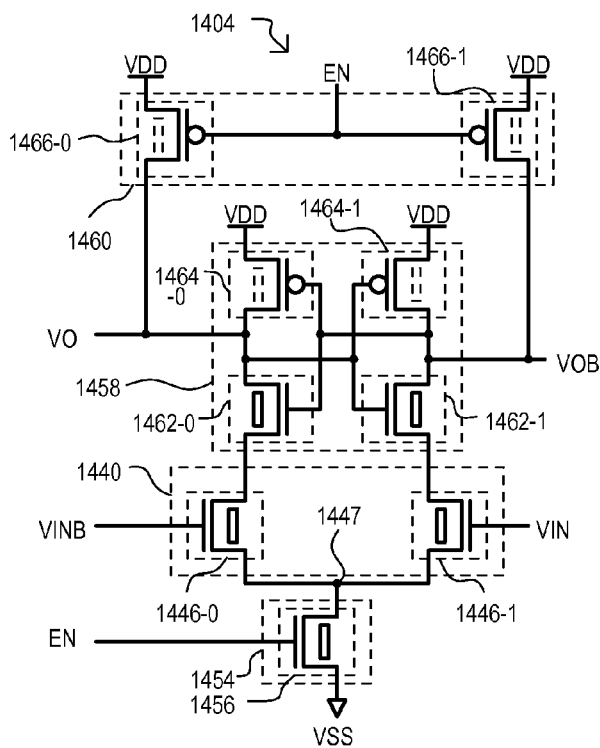
FIG. 14 is a schematic diagram of an analog comparator circuit according to an embodiment.

Referring now to FIG. 14, another analog circuit including a differential pair of DDC transistors according to an embodiment is shown in block schematic diagram. FIG. 14 shows an analog comparator circuit 1404 that can include a differential pair of DDC transistors 1440, an enable switch 1454, a latching driver 1458, and a precharge circuit 1460. Differential pair 1440 may take the form of that shown in FIG. 10, or an equivalent.

An enable switch 1454 may connect common sources (node 1447) of the differential pair 1440 to a power supply node VSS in response to an enable signal EN, to thereby enable a sensing operation of differential pair 1440. In the particular embodiment shown, enable switch 1454 may include a switch transistor 1456 having a source-drain path coupled between node 1447 and VSS, and may have a gate coupled to a receive the enable signal EN.

A latching driver 1458 may latch the differential voltage generated at the drains of differential pair transistors 1446-0 and 1446-1. In the particular embodiment shown, latching driver 1458 may include first conductivity (in this case n-channel) driver transistors 1462-0/1 and second conductivity (in this case p-channel) driver transistors 1464-0/1. Driver transistor 1462-0 may have a source-drain path coupled between a drain of differential pair transistor 1446-0 and a first output node VO, and a gate connected to second output node VOB. Driver transistor 1462-1 may have a source-drain path coupled between a drain of differential pair transistor 1446-1 and a second output node VOB, and gate connected to first output node VO. In a cross-coupled fashion, driver transistor 1464-0 may have a source-drain path coupled between first output node VO and a high power supply VDD, and a gate connected to second output node VOB, and driver transistor 1464-1 may have a source-drain path coupled between second output node VOB and a high power supply VDD, and a gate connected to first output node VO.

Precharge circuit 1460 may precharge first and second output nodes VO/VOB to a precharge voltage prior to a compare operation, and then release such nodes (i.e., allow them to float) during a compare operation. In the very particular embodiment shown, precharge circuit 1460 may precharge output nodes VO/VOB to a high power supply voltage VDD, and includes a first precharge transistor 1466-0 having a source-drain path coupled between first output node VO and a high power supply node VDD, and a gate that receives the enable signal EN, and a second precharge transistor 1466-1 having a source-drain path coupled between second output node VOB and a high power supply node VDD, and a gate that also receives the enable signal EN.

In one embodiment, transistors of an enable switch 1454, a latching driver 1458, and a precharge circuit 1460 may all be DDC transistors. However, in alternate embodiments, any transistors of such circuit sections may be conventional transistors and/or low Vt transistors. Still further, all such transistors may have body biasing variations described herein, including standard body biasing and forward body biasing.

In this way, an IC device may include an analog comparator that employs DDC transistors.

Referring now to FIGS. 15A and 15B, an advantageous response of an analog comparator circuit according to an embodiment is shown in a pair of graphs. FIG. 15A and 15B are simulation responses of an analog comparator like that of FIG. 14. FIG. 15A shows a response of such an analog comparator with conventional transistors having a "halo" (e.g., pocket) implant. FIG. 15B shows a response of analog comparator of FIG. 14 that includes all DDC transistors.

FIGS. 15A and 15B are Monte Carlo plots generated by placing mismatches on transistors of the analog comparator, and then recording the input difference (VIN-VINB) that results in the comparator driving its output between high and low values (e.g., VDD to VSS, or VSS to VDD). The horizontal axes show the input offset difference, the vertical axes show the number of units exhibiting the offset response.

As shown, the DDC analog comparator results in a smaller offset voltage variation than the conventional case.

Referring now to FIG. 16, a further analog circuit according to an embodiment is shown in block schematic diagram. FIG. 16 shows an operational amplifier (op amp) circuit 1670. An op amp 1670 may include a differential input section 1678, an input bias section 1672, an output bias section 1674, and an output driver circuit 1676. An op amp 1670 may amplify values received between a noninverting input (+) and an inverting input (−).

As shown in FIG. 16, differential input section 1678 may include a differential pair of DDC transistors 1640, as disclosed herein, or an equivalent. In addition or alternatively, input and/or output biasing sections (1672 or 1674) may include one or more current mirrors that employ DDC transistors, as disclosed herein, or equivalents.

In this way, an operational amplifier circuit may include DDC transistors.

While the above embodiments have shown very particular analog circuits, alternate embodiments may include various other analog circuits including but not limited to: high speed I/O circuits, including transceiver circuits; and data converter circuits, including "flash" analog-to-digital converters.

While embodiments above have shown the inclusion of DDC transistors in analog circuits and ICs containing such circuits, the invention may also be conceptualized as an analog IC device having various sections, each section including transistors of a particular type. Examples of such embodiments are shown in FIGS. 17A and 17B.

FIG. 17A is a block schematic diagram of an analog IC device 1700-A according to an embodiment. An analog IC device 1700-A may execute analog signal generating or processing and includes a first section 1780 and one or more other sections (one shown as 1782). In the embodiment of FIG. 17A, a first section 1780 includes DDC transistors, in this embodiment, n-channel DDC transistors. The other section 1782 may include any of: p-channel DDC transistors, p-channel conventional transistors, including standard Vt and/or standard body bias transistors, low Vt p-channel transistors, or p-channel transistors with a forward body bias.

FIG. 17B is a block schematic diagram of an IC device 1700-B like that of FIG. 17A, but with transistor conductivities reversed. Thus, an IC device 1700-B executes analog signal generating or processing function and includes a first section 1780' with p-channel DDC transistors, and one or more other sections 1782 that include any of numerous other n-channel transistors.

As noted in conjunction with FIG. 2A, a DDC transistor may take various forms. A DDC transistor according to one very particular embodiment will now be described with reference to FIG. 18. Such a transistor may be included in any of the embodiments shown above, or equivalents.

Figure 18:
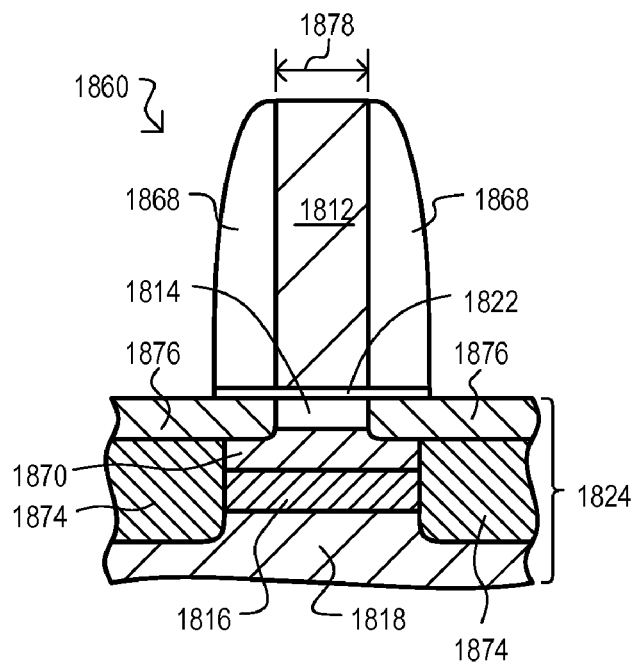
FIG. 18 shows a DDC transistor that may be included in embodiments.

Referring now to FIG. 18, a DDC according to a very particular embodiment is shown in a side cross sectional view. A DDC transistor 1860 may include a gate 1812 separated from a substrate 1824 by a gate insulator 1822. A gate 1812 may include insulating sidewalls 1868 formed on its sides. Source and drain regions may include a lightly doped drain (LDD) structures 1876 formed over deep source/drain diffusions 1874 to extend towards each other under a portion of the gate. A DDC stacked channel structure may be formed by a substantially undoped channel layer 1814, a threshold voltage (Vt) set layer 1870 formed by epitaxial growth and implant, or alternatively, by controlled out-diffusion from a screening layer 1816 positioned below the undoped channel layer 1814. The screening layer 1816 acts to define termination of the depletion zone below the gate, while the Vt set layer 1870 adjusts Vt to meet transistor design specifications. In the embodiment shown, screening layer 1816 may be implanted into body/bulk region 1818 so that it extends between and in contact with the source and drain diffusions 1874.

In a very particular embodiment, a DDC transistor 1860 may be an n-channel transistor manufactured on a 28 nm generation process, and can have a gate length 1878 suitable to the analog circuit role in which it is employed. In very particular embodiments, such gate lengths may be in the range of about 50 to 120 nm. The screening layer 1816 may have a carrier concentration of greater than about $5 \times 10^{18}$ donors/cm$^3$, while an overlying Vt set layer 1870 may have a carrier concentration of about $5 \times 10^{17}$ to about $5 \times 10^{18}$ donors/cm$^3$ A substantially undoped channel region 1814 may have a carrier concentration of less than about $5 \times 10^{17}$ donors/cm$^3$. It is understood that the above noted carrier concentrations are provided by way of example only and alternate embodiments may include different concentrations according to desired performance in An analog circuit.

Figure 19:
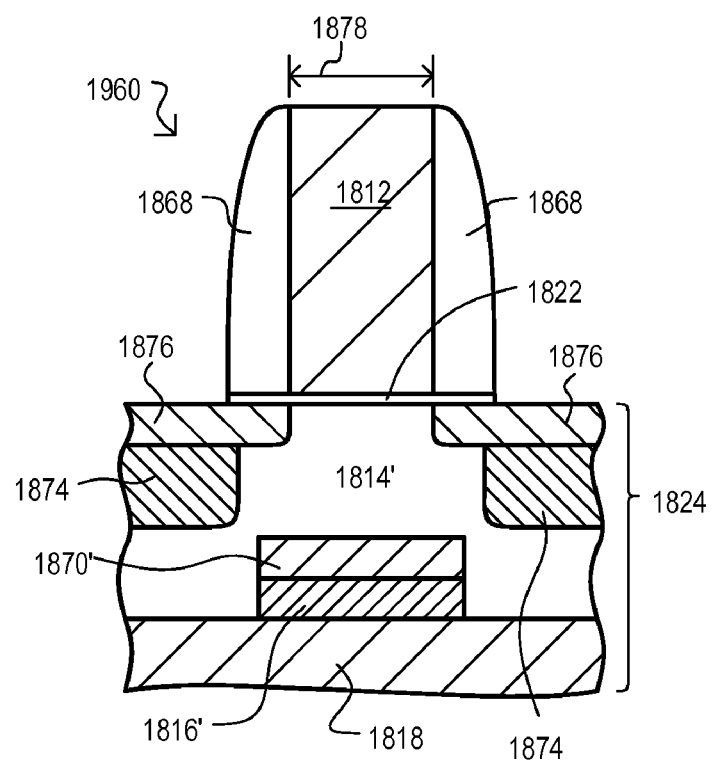
FIG. 19 shows another DDC transistor that may be included in embodiments.

A DDC transistor according to a further embodiment is shown in FIG. 19, and designated by the general reference character 1960. A DDC transistor 1960 may include items like those shown in FIG. 18, and like items are referred to by the same reference character. DDC transistor 1860 differs from that of FIG. 18 in that screening layer 1816 may be implanted into body/bulk region 1818 so that it extends below the gate without contacting the source and drain diffusions 1874. The above DDC transistors are but particular implementations of a DDC transistor, and should not construed as unduly limiting the circuit elements included within the various analog circuit embodiments shown herein.

While some analog circuits disclosed herein have included circuit sections with conductivities of one type, alternate embodiments could reverse such conductivities as would be well understood by those skilled the art. As but a few very particular examples, the embodiment shown in FIGS. 5, 7A to 11, 13A to 14, and 16 may be formed with transistor conductivities (and hence power supply nodes) reversed.

Embodiments of the invention, and their equivalents may provide improved performance over conventional circuits by operating with transistors (e.g., DDC transistors) having highly matching characteristics, particularly threshold voltage (Vt). Possible improvements may include faster signal propagation times, as noted above.

Closer matching of transistor characteristics may translate into reductions in transistor size, and hence reductions in device manufacturing cost and/or power consumption. Reduction in size may also result in reduced input capacitance for IC devices receiving input signals on DDC transistor gates. Highly matching transistors at differential inputs may provide greater input range.

Undoped analog circuit transistor channels may allow for shorter channel devices for increased current driving capability and/or driving speed as compared to conventional transistors.

As shown in embodiments above, low transistor variability presented by the inclusion of DDC transistors differential pairs, or the like, can result in amplifier circuits with lower offset voltages. Such an advantage can provide for higher amplifier performance.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A circuit, comprising:
a plurality of transistors having controllable current paths coupled between at least a first and second node, the transistors configured to generate an analog electrical output signal in response to an analog input value, wherein
at least one of the transistors has a deeply depleted channel formed below its gate defined by a substantially undoped channel region formed over a relatively highly doped screen layer formed over a doped body region, wherein:
the plurality of transistors includes at least one first biased transistor and at least one second biased transistor, the first biased transistor having a body coupled to receive a standard bias voltage, the second biased transistor having a body coupled to receive a forward bias voltage that lowers the threshold voltage of the second biased transistor with respect to the first biased transistor.

2. The circuit of claim 1, wherein:
at least the second biased transistor includes the deeply depleted channel.

3. A circuit, comprising:
a plurality of transistors having controllable current paths coupled between at least a first and second node, the transistors configured to generate an analog electrical output signal in response to an analog input value, wherein
at least one of the transistors has a deeply depleted channel formed below its gate that includes a substantially undoped channel region formed over a relatively highly doped screen layer formed over a doped body region, wherein
the plurality of transistors includes a differential pair of transistors, comprising a first transistor having a gate coupled to receive a first input signal and a source coupled to a bias node, and a second transistor having a gate coupled to receive a second input signal and a source coupled to the bias node, wherein the first and second transistors are matching transistors that both include the deeply depleted channel;
a differential amplifier circuit comprising the differential pair of transistors, and a biasing circuit coupled to the bias node that limits a current flow through the differential pair of transistors, wherein
the biasing circuit includes at least one bias transistor having a source-drain path coupled between the bias node and a power supply node, and a gate coupled to receive a bias control signal;
wherein the plurality of transistors includes standard biased transistors of a first conductivity type having bodies coupled to a standard body bias voltage; and
wherein the at least one bias transistor is of the first conductivity type and has a body coupled to a forward body bias voltage different from the standard body bias voltage, the forward body bias voltage lowering the threshold voltage of the bias transistor with respect to the standard biased transistors.

4. A circuit, comprising:
a plurality of transistors having controllable current paths coupled between at least a first and second node, the transistors configured to generate an analog electrical output signal in response to an analog input value, wherein
at least one of the transistors has a deeply depleted channel formed below its gate that includes a substantially undoped channel region formed over a relatively highly doped screen layer formed over a doped body region, wherein
the plurality of transistors includes a differential pair of transistors, comprising a first transistor having a gate coupled to receive a first input signal and a source coupled to a bias node, and a second transistor having a gate coupled to receive a second input signal and a source coupled to the bias node, wherein the first and second transistors are matching transistors that both include the deeply depleted channel;
a differential amplifier circuit comprising the differential pair of transistors, and a biasing circuit coupled to the bias node that limits a current flow through the differential pair of transistors, wherein
the biasing circuit including at least one bias transistor having a source-drain path coupled between the bias node and a power supply node, and a gate coupled to receive a bias control signal;
wherein the plurality of transistors includes standard threshold voltage (Vt) transistors of a first conductivity type, and the at least one bias transistor is a low Vt transistor of the first conductivity type, having a lower threshold voltage than the standard Vt transistors.

5. A circuit, comprising:
a plurality of transistors having controllable current paths coupled between at least a first and second node, the transistors configured to generate an analog electrical output signal in response to an analog input value, wherein
at least one of the transistors has a deeply depleted channel formed below its gate that includes a substantially undoped channel region formed over a relatively highly doped screen layer formed over a doped body region, wherein
the plurality of transistors includes a differential pair of transistors, comprising a first transistor having a gate coupled to receive a first input signal and a source coupled to a bias node, and a second transistor having a gate coupled to receive a second input signal and a source coupled to the bias node, wherein the first and second transistors are matching transistors that both include the deeply depleted channel;
an analog comparator comprising:
the differential pair of transistors, and
an enable circuit configured to enable and disable a current path between the bias node and a first power supply node in response to an enable signal.

6. The circuit of claim 5, wherein:
the plurality of transistors includes standard threshold voltage (Vt) transistors of a first conductivity type; and
the enable circuit includes at least one enable transistor having a source-drain path coupled between the bias node and a power supply node, and a gate coupled to receive the enable signal, the enable transistor being a low Vt transistor of the first conductivity type, having a lower threshold voltage than the standard Vt transistors.

7. The circuit of claim 5, wherein:
the analog comparator circuit further includes:
a first driver transistor having a source coupled to a second power supply node, a gate coupled to a drain of the first transistor of the differential pair, and drain coupled to the drain of the second transistor of the differential pair, and
a second driver transistor having a source coupled to the second power supply node, a gate coupled to a drain of the second transistor of the differential pair, and drain coupled to the drain of the first transistor of the differential pair; wherein
the first and second driver transistors have deeply depleted channel, and are of an opposite conductivity type than the differential pair of transistors.

8. A method, comprising:
generating an analog output signal by controlling currents flowing through at least two transistors of a same conductivity type, at least two of the transistors being a deeply depleted channel (DDC) transistor having a substantially undoped channel region formed over a relatively highly doped screen layer formed over a doped body region, wherein
controlling currents through the at least two transistors includes mirroring a current flowing through a reference transistor in a mirror transistor, at least the mirror transistor being a DDC transistor for a less variable tracking of a current through the reference transistor by the mirror transistor as compared to an equivalently sized doped channel transistor, wherein
controlling currents through the at least two transistors includes
configuring a first and second transistor into a differential pair having commonly connected sources, and
applying an input signal between the gates of the first and second transistors, wherein
the first and second transistors are DDC transistors that provide for a less variable input offset voltage as compared to equivalently sized and doped channel transistors;
dynamically coupling the commonly connected sources to a power supply node to enable a comparator sensing operation of the differential pair.

9. A method, comprising:
generating an analog output signal by controlling currents flowing through at least two transistors of a same conductivity type, at least two of the transistors being a deeply depleted channel (DDC) transistor having a substantially undoped channel region formed over a relatively highly doped screen layer formed over a doped body region, wherein
controlling currents through the at least two transistors includes mirroring a current flowing through a reference transistor in a mirror transistor, at least the mirror transistor being a DDC transistor for a less variable tracking of a current through the reference transistor by the mirror transistor as compared to an equivalently sized and doped channel transistor, wherein
controlling currents through the at least two transistors includes
configuring a first and second transistor into a differential pair having commonly connected sources, and
applying an input signal between the gates of the first and second transistors, wherein
the first and second transistors are DDC transistors that provide for a less variable input offset voltage as compared to equivalently sized doped channel transistors;
coupling the at least two DDC transistors to a first power supply node by at least one low threshold voltage (Vt) transistor of the same conductivity type, wherein
the low Vt transistor has a lower threshold voltage than the two DDC transistors.

10. The method of claim 9, further including:
coupling the at least two DDC transistors to a second power supply node by at least one low Vt transistor of a different conductivity type.

11. The method of claim 10, wherein:
the at least one low Vt transistor of the different conductivity type is selected from the group consisting of: a DDC transistor, a transistor having a doped channel and a lower Vt than other transistors of the same conductivity type, and a transistor having a threshold voltage lowering forward bias voltage applied to its body that is different than a body bias voltage applied to other transistors of the same conductivity type circuit.

12. An integrated circuit (IC) device, comprising:
at least one analog circuit formed in a semiconductor substrate, comprising
  a first portion having a plurality of interconnected deeply depleted channel (DDC) transistors of a first conductivity type, each DDC transistor having a substantially undoped channel region formed over a relatively highly doped screen layer formed over a doped body region;
  a second portion having a plurality of interconnected first transistors of a second conductivity type coupled between a first power supply node and the first portion,
  wherein the first transistors comprise standard threshold voltage (Vt) transistors having a first Vt;
  a third portion comprising second transistors of the second conductivity type having a lower Vt than the first transistors, the second transistors being selected from the group consisting of: transistors having a threshold voltage lowering forward bias voltage applied to their bodies that is different than a body bias voltage applied to the first transistors, and transistors having channel doping different than the first transistors.

13. An integrated circuit (IC) device, comprising:
at least one analog circuit formed in a semiconductor substrate, comprising
  a first portion having a plurality of interconnected deeply depleted channel (DDC) transistors of a first conductivity type, each DDC transistor defined by a substantially undoped channel region formed over a relatively highly doped screen layer formed over a doped body region;
  a second portion having a plurality of interconnected first transistors of a second conductivity type coupled between a first power supply node and the first portion,
  a third portion comprising second transistors of the first conductivity type coupled between a second power supply node and the first portion, the second transistors receiving a body bias voltage different than a body bias voltage received by the DDC transistors of the first portion.

* * * * *